United States Patent
Tanaka et al.

(10) Patent No.: US 9,101,070 B2
(45) Date of Patent: Aug. 4, 2015

(54) METHOD FOR MANUFACTURING MULTILAYER PRINTED WIRING BOARD

(75) Inventors: Hironori Tanaka, Ogaki (JP); Keisuke Shimizu, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 13/185,295

(22) Filed: Jul. 18, 2011

(65) Prior Publication Data

US 2011/0271524 A1 Nov. 10, 2011

Related U.S. Application Data

(60) Division of application No. 12/186,604, filed on Aug. 6, 2008, now Pat. No. 8,471,153, which is a continuation of application No. PCT/JP2007/070108, filed on Oct. 15, 2007.

(30) Foreign Application Priority Data

Apr. 18, 2007 (JP) .................... 2007-109828

(51) Int. Cl.
H05K 1/16 (2006.01)
H05K 1/09 (2006.01)
H05K 3/46 (2006.01)

(52) U.S. Cl.
CPC ........ *H05K 1/162* (2013.01); *H05K 1/09* (2013.01); *H05K 3/4602* (2013.01);
(Continued)

(58) Field of Classification Search
CPC ....... H05K 1/162; H05K 1/09; H05K 3/4602; H05K 2201/0352; H05K 2201/09509; H05K 2201/09518; H05K 2201/096; H05K 2201/09718; H05K 2201/09309; Y10T 29/4913; Y10T 29/49126; Y10T 29/49146
USPC ............... 29/830, 832, 834, 841, 846; 174/250–268; 361/748–803
See application file for complete search history.

(56) References Cited

U.S. PATENT DOCUMENTS 5,709,979 A * 1/1998 Casson et al. ............ 430/311
6,724,638 B1 4/2004 Inagaki et al.
(Continued)

FOREIGN PATENT DOCUMENTS

EP 1 646 072 A2 4/2006
EP 1 936 682 A1 6/2008
(Continued)

OTHER PUBLICATIONS

U.S. Appl. No. 13/170,348, filed Jun. 28, 2011, Tanaka.
(Continued)

*Primary Examiner* — Livius R Cazan
(74) *Attorney, Agent, or Firm* — Oblon, McClelland, Maier & Neustadt, L.L.P.

(57) ABSTRACT

A multilayer printed wiring board includes a core substrate, a resin insulation layer laminated on the core substrate and a capacitor section coupled to the resin insulating layer. The capacitor section includes a first electrode including a first metal and configured to be charged by a negative charge, and a second electrode including a second metal and opposing the first electrode, the second electrode configured to be charged by a positive charge. A dielectric layer is interposed between the first electrode and second electrode, and an ionization tendency of the first metal is larger than and ionization tendency of the second metal.

15 Claims, 11 Drawing Sheets

(52) U.S. Cl.
CPC . *H05K 2201/0352* (2013.01); *H05K 2201/096* (2013.01); *H05K 2201/09309* (2013.01); *H05K 2201/09509* (2013.01); *H05K 2201/09518* (2013.01); *H05K 2201/09718* (2013.01); *Y10T 29/4913* (2015.01)

(56) References Cited

U.S. PATENT DOCUMENTS

| | | | |
|---|---|---|---|
| 6,775,150 | B1 | 8/2004 | Chakravorty et al. |
| 6,876,091 | B2 | 4/2005 | Takeuchi et al. |
| 7,038,310 | B1 * | 5/2006 | Nakatani et al. ............... 257/706 |
| 7,336,501 | B2 | 2/2008 | Tanaka |
| 7,480,150 | B2 | 1/2009 | Kariya et al. |
| 7,649,748 | B2 | 1/2010 | Kariya et al. |
| 7,817,440 | B2 | 10/2010 | Kariya et al. |
| 7,856,710 | B2 | 12/2010 | Kariya et al. |
| 7,888,803 | B2 | 2/2011 | Kariya et al. |
| 7,982,139 | B2 | 7/2011 | Kariya et al. |
| 2002/0153165 | A1 | 10/2002 | Kojima et al. |
| 2003/0068517 | A1 * | 4/2003 | Andresakis et al. .......... 428/607 |
| 2004/0087058 | A1 | 5/2004 | Ooi et al. |
| 2004/0160751 | A1 | 8/2004 | Inagaki et al. |
| 2006/0000542 | A1 | 1/2006 | Min et al. |
| 2006/0137905 | A1 * | 6/2006 | Kariya et al. ................. 174/255 |
| 2006/0245139 | A1 | 11/2006 | Kariya |
| 2007/0025059 | A1 | 2/2007 | Uchida et al. |
| 2007/0132063 | A1 * | 6/2007 | Min et al. ..................... 257/532 |
| 2007/0132088 | A1 | 6/2007 | Kariya et al. |
| 2007/0134910 | A1 | 6/2007 | Kariya et al. |
| 2007/0297157 | A1 | 12/2007 | Tanaka |
| 2008/0142976 | A1 | 6/2008 | Kawano |
| 2009/0064493 | A1 | 3/2009 | Kariya et al. |
| 2009/0175011 | A1 | 7/2009 | Kariya |
| 2009/0200069 | A1 | 8/2009 | Kariya et al. |
| 2009/0200639 | A1 | 8/2009 | Kariya |
| 2010/0181285 | A1 | 7/2010 | Tanaka |
| 2010/0193227 | A1 | 8/2010 | Kariya et al. |
| 2010/0200285 | A1 | 8/2010 | Kariya et al. |
| 2011/0063811 | A1 | 3/2011 | Kariya et al. |

FOREIGN PATENT DOCUMENTS

| | | |
|---|---|---|
| JP | 6-32613 | 2/1994 |
| JP | 7-254764 A | 10/1995 |
| JP | 10-247781 | 9/1998 |
| JP | 2001-068858 | 3/2001 |
| JP | 2001-177004 A | 6/2001 |
| JP | 2005-191559 | 7/2005 |
| JP | 2006-135036 | 5/2006 |
| JP | 2006-140454 | 6/2006 |
| WO | WO 2005055684 A1 * | 6/2005 |
| WO | WO 2006/049195 A1 | 5/2006 |
| WO | WO 2006/134977 A1 | 12/2006 |
| WO | WO2007-043682 A1 | 4/2007 |

OTHER PUBLICATIONS

U.S. Appl. No. 13/175,683, filed Jul. 1, 2011, Kariya, et al.

* cited by examiner

METHOD FOR MANUFACTURING MULTILAYER PRINTED WIRING BOARD

CROSS REFERENCE TO RELATED APPLICATIONS

The present application is a divisional of and claims the benefit of priority to U.S. application Ser. No. 12/186,604, filed on Aug. 6, 2008, now U.S. Pat. No. 8,471,153, issued Jun. 25, 2013, which is a continuation of International Application No. PCT/JP2007/070108, filed Oct. 15, 2007, and claims the benefit of priority of JP 2007-109828, filed Apr. 18, 2007. The contents of each of these applications are incorporated herein by reference in their entirety.

TECHNICAL FIELD

The present invention relates to a multilayer printed wiring board and a manufacturing method thereof.

DESCRIPTION OF RELATED ART

A multilayer printed wiring board includes multiple wiring patterns laminated with insulation layers between them and electrically connected to each other through via holes in the insulation layers. The present inventors recognized that in such a type of multilayer printed wiring board, switching noise caused by high-speed on/off switching of a mounted semiconductor element may lower the electrical potential of the power-source line. There is an effort in the printed wiring board industry to address this problem.

SUMMARY OF THE INVENTION

One aspect of the invention includes a multilayer printed wiring board that includes a core substrate, a resin insulation layer laminated on the core substrate and a capacitor section coupled to the resin insulating layer. The capacitor section includes a first electrode including a first metal and configured to be charged by a negative charge, and a second electrode including a second metal and opposing the first electrode, the second electrode configured to be charged by a positive charge. A dielectric layer is interposed between the first electrode and second electrode, and an ionization tendency of the first metal is larger than and ionization tendency of the second metal.

Another aspect of the invention includes a method for manufacturing a multilayer printed wiring board. The method includes providing a core substrate, laminating a resin insulation layer on the core substrate and forming a capacitor section coupled to the resin insulating layer. The capacitor section is formed by providing a first electrode including a first metal and charged by a negative charge. A second electrode is provided opposed to the first electrode and charged by a positive charge, the second electrode including a second metal having a smaller ionization tendency than an ionization tendency of the first metal forming the first electrode. A dielectric layer is interposed between the first and second electrode.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF EMBODIMENTS

Figure 1:
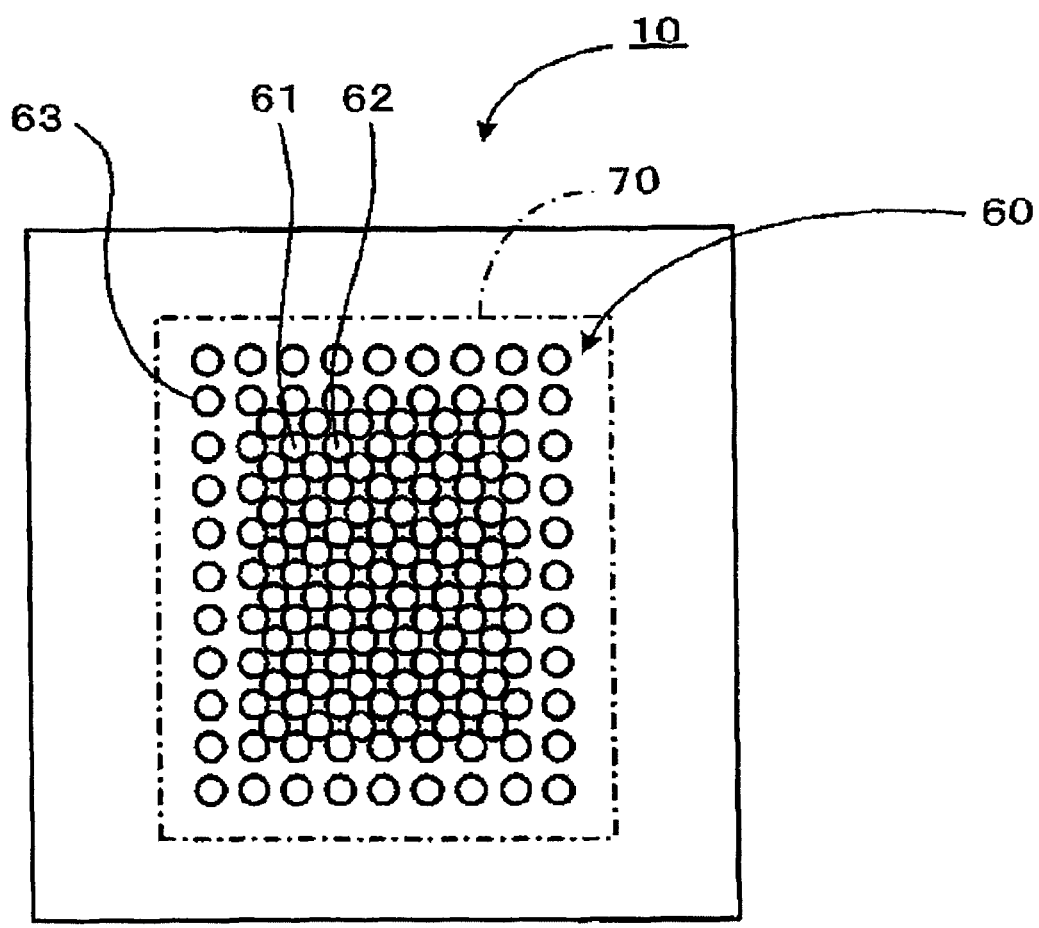
FIG. 1 is a plan view of a multilayer printed wiring board according to one embodiment of the invention.

As noted above, there is an effort in the printed wiring board industry to address a lower electrical potential on the power source line caused by switching noise. To suppress such a falloff in electrical potential, Patent Publication Japanese Laid-Open Patent Application 2001-68858 discloses a multilayer printed wiring board in which a capacitor section is connected between a power-source line and a ground line to achieve decoupling.

However, in the capacitor section formed in the multilayer printed wiring board in Patent Publication Japanese Laid-Open Patent Application 2001-68858, a dielectric layer made of organic resin containing inorganic filler is used. Thus, capacitance may not be increased enough, and a sufficient decoupling effect may be hard to achieve.

Thus, a multilayer printed wiring board is disclosed in Patent Publication Japanese Laid-Open Patent Application 2005-191559, in which a capacitor section is structured with two electrodes sandwiching a high-$_K$ dielectric layer made of ceramics, and one of the electrodes is connected to a power-source line and the other to the ground line.

The capacitor section formed in the multilayer printed wiring board disclosed in Patent Publication Japanese Laid-Open Patent Application 2005-191559 is first formed by disposing on an electrode a sol-gel solution, which is then calcined to form a high-$_K$ dielectric layer. After that, the other electrode is formed. Accordingly, the first electrode is exposed to high heat during the calcination process for forming a high-$_K$ dielectric layer. It is believed that such high heat creates a problem in that it tends to degrade the first electrode.

In Patent Publication PCT International Publication WO 07/043682, technology is suggested that the electrode heated along with the high-$_K$ dielectric layer be made of heat-tolerant nickel and the other electrode be made of copper, which has low resistivity and is easy to process. However, when DC voltage is applied to the capacitor section formed in the above multilayer printed wiring board, it is believed that a problem arises in that a migration phenomenon can occur in the metals forming the electrodes, and the metal spread into the high-$_K$ dielectric layer can reduce the insulation resistance of the high-$_K$ dielectric layer.

One objective of the present invention is to provide a multilayer printed wiring board, and manufacturing method, in which insulation resistance of a high-$_K$ dielectric layer in the capacitor section seldom lowers. Another objective of the present invention is to provide a multilayer printed wiring board, and manufacturing method, that has a capacitor section in which migration seldom occurs at electrodes.

To achieve the above objectives, a multilayer printed wiring board according to a first aspect of the present invention has a core substrate, a resin insulation layer laminated on the core substrate, and a capacitor section structured with a dielectric layer sandwiched between a first electrode that charges negative electric charges and an opposite second electrode that charges positive electric charges. An ionization tendency of a metal forming the first electrode is greater than an ionization tendency of a metal forming the second electrode.

To achieve the above objectives, the method for manufacturing a multilayer printed wiring board according to a second aspect of the present invention is characterized by a core-substrate forming step to form a core substrate, a resin-insulation-layer lamination step to laminate a resin insulation layer on the core substrate, and a capacitor-section forming step. In the capacitor forming step, a capacitor section is formed by sandwiching a dielectric layer with a first electrode that charges negative charges and a second electrode that charges positive charges, and the second electrode is made of a metal with a smaller ionization tendency than the ionization tendency of a metal forming the first electrode.

In the capacitor section of a multilayer printed wiring board according to embodiment of the present invention, the ionization tendency of a metal forming the first electrode on the anode side is greater than the ionization tendency of a metal forming the second electrode on the cathode side. Therefore, a metal migration phenomenon at the electrodes, especially at the second electrode on the cathode side, seldom occurs. Accordingly, the insulation resistance of the capacitor section seldom lowers.

Figure 2:
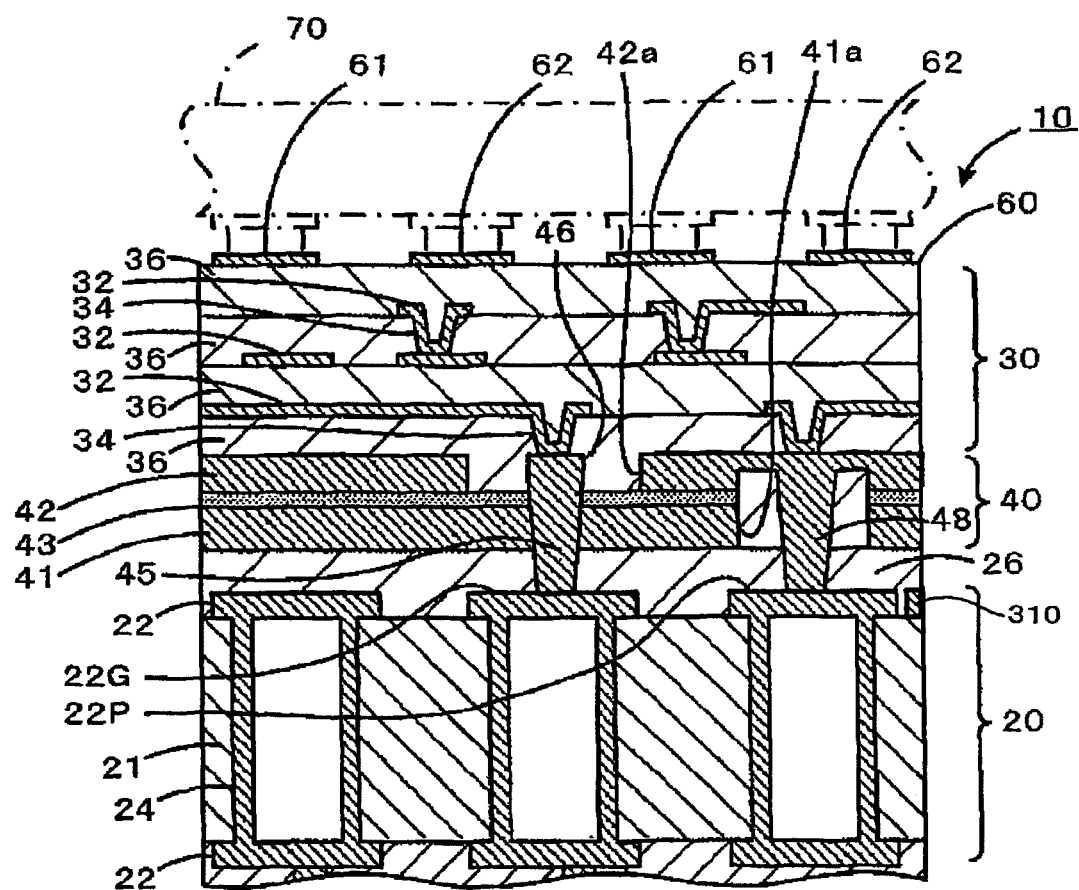
FIG. 2 is a cross-sectional view illustrating a part of the printed wiring board according to the embodiment of FIG. 1.
Figure 3:
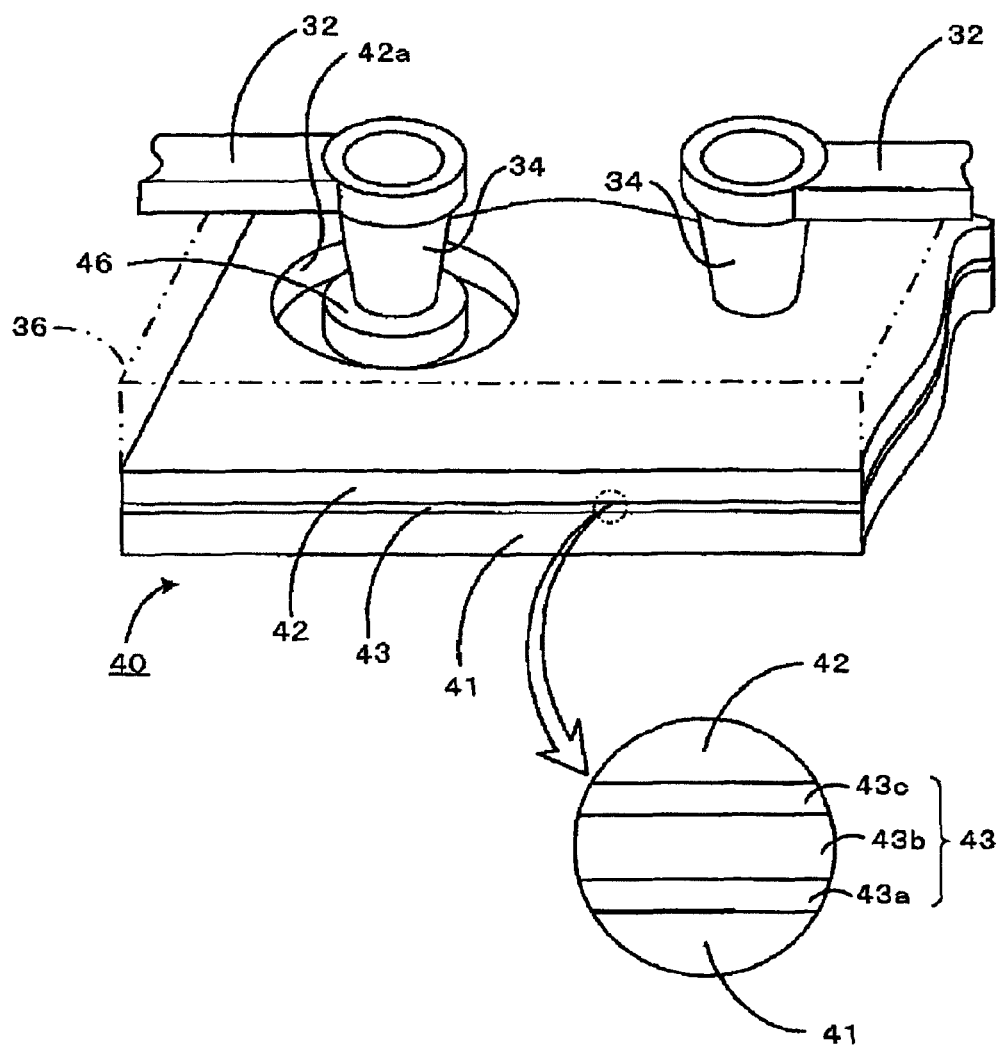
FIG. 3 is a perspective view of a thin-film capacitor in the printed wiring board according to the embodiment of FIG. 1.

Multilayer printed wiring board 10 according to Embodiment 1 is shown in FIG. 1 as a plan view and in FIG. 2 as a cross-sectional view illustrating an essential part. Also, thin-film capacitor 40 in multilayer printed wiring board 10 is shown in FIG. 3.

Multilayer printed wiring board 10 according to this embodiment has mounting section 60 to mount semiconductor element 70 on its surface as shown in FIG. 1. Formed in mounting section 60 are: pads 61 connected to ground lines 73 that ground semiconductor element 70; power-source pads 62 connected to power-source lines 71 that supply positive power-source potential for semiconductor element 70; and signal pads 63 connected to signal lines 72 that input/output signals to semiconductor element 70 (see FIG. 9).

Ground pads 61 and power-source pads 62 are arranged in lattice or zigzag fashion around the center, and signal pads 63 are arranged around them in lattice, zigzag or at random. Ground pads 61 are connected to external ground terminals 74 (see FIG. 9) formed on the surface opposite mounting section 60 by means of ground lines 73 that are formed in multilayer printed wiring board 10 so as to be made independent of power-source lines 71 and signal lines 72. Power-source pads 62 are connected to external power-source terminals 75 (see FIG. 9) formed on the surface opposite mounting section 60 by means of power-source lines 71 that are formed in multilayer printed wiring board 10 so as to be made independent of ground lines 73 and signal lines 72.

Power-source lines 71 are connected to upper electrode 42 of thin-film capacitor 40 (see FIG. 2). Ground lines 73 are connected to lower electrode 41 of thin-film capacitor 40. Signal pads 63 are connected to external signal terminals 76 (see FIG. 9) formed on the surface opposite mounting section 60 by means of signal lines 72 that are formed in multilayer printed wiring board 10 so as to be made independent of power-source lines 71 and ground lines 73. The total number of pads in mounting section 60 is in the range of 1,000-30,000.

Also, as shown in FIG. 2, multilayer printed wiring board 10 is structured with core substrate 20, insulation layer 26 on the core substrate, thin-film capacitor 40, build-up section 30 and mounting section 60. Insulation layer 26 on the core substrate is a resin insulation layer and is formed on the upper side of core substrate 20. Thin-film capacitor 40 is formed on insulation layer 26 on the core substrate. Build-up section 30 is formed on thin-film capacitor 40. Mounting section 30 is formed on the uppermost layer of build-up section 30. Each pad (61, 62, 63) of mounting section 60 is electrically connected to conductive layers 32 in build-up section BU conductive layers, which are wiring patterns laminated in build-up section 30.

Core substrate 20 is structured with core substrate body 21, conductive layers 22, 22 made of copper and formed on both upper and lower surfaces of core substrate body 21, and through-hole conductors 24. Core substrate body 21 is made of BT (bismaleimide triazine) resin, glass epoxy resin or the like. Through-hole conductors 24 are configured cylindrically and formed on the internal circumferences of the through-holes that penetrate through the upper and lower surfaces of core substrate body 21. Both conductive layers 22, 22 are electrically connected by means of through-hole conductors 24. On the upper surface of core substrate 20, alignment mark 310 is formed alongside conductive layer 22.

As shown in FIGS. 2 and 3, thin-film capacitor 40 as a capacitor section is structured with high-$_K$ dielectric layer 43 made of ceramic high-$_K$ dielectric material calcined at a high temperature, and with lower electrode 41 and upper electrode 42 sandwiching high-$_K$ dielectric layer 43. Lower electrode 41 is formed with nickel and electrically connected to ground pads 61 of mounting section 60. Upper electrode 42 is formed with copper having a smaller ionization tendency than nickel, and is electrically connected to power-source pads 62 of mounting section 60 to which positive electrical potential is applied. Accordingly, lower electrode 41 and upper electrode 42 are respectively connected to ground lines 73 and power-source lines 71 of semiconductor element 70 mounted on mounting section 60.

Figure 9:
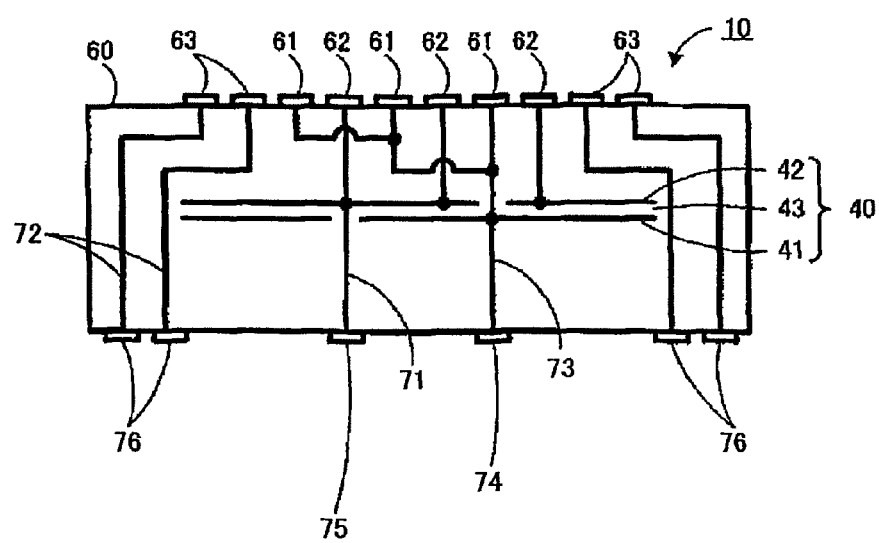
FIG. 9 is a schematic view of a multilayer printed wiring board to illustrate a continuity check.

As shown in FIG. 9, when ground electrical potential is applied to ground lines 73 and positive electrical potential is applied to power-source lines 71 from power source PW, lower electrode 41 becomes negatively charged and upper electrode 42 becomes positively charged. Thus, if a metal with great (high) ionization tendency is used for an electrode that charges negative electric charges and a metal with small low ionization tendency is used for another electrode that charges positive electric charges, migration phenomena seldom occur.

As for metals to form electrodes, for example, lower electrode 41 may be formed with tin, and upper electrode 42 with platinum. Also, lower electrode 41 may be formed, for example, with nickel, and upper electrode 42 with gold. Moreover, lower electrode 41 may be formed, for example, with nickel, and upper electrode 42 with tin. Other than those, if a metal to form lower electrode 41 satisfies such a condition that its ionization tendency is larger than the ionization tendency of a metal to form upper electrode 42, varieties of metals such as copper, nickel, tin, platinum, or gold may be used.

At least either a metal to form lower electrode 41 or a metal to form upper electrode 42 is preferred to have a melting point in the range of 600° C.-2,000° C., more preferably in the range of 1,100° C.-2,000° C. That is because a sol-gel film is formed by a sol-gel method on one of the electrodes, which is then calcined at a high temperature.

Also, lower electrode 41 is a plain pattern formed on the lower surface of high-$_K$ dielectric layer 43. Lower electrode 41 has pass-through holes 41a. Upper via-hole conductors 48, as second via-hole conductors, penetrate pass-through holes 41a without making contact with lower electrode 41. Upper via-hole conductors 48 electrically connect upper electrode 42 and power-source conductive layer 22P, which is among conductive layers 22 of core substrate 20. Lower electrode 41 may have pass-through holes that allow each signal line to penetrate vertically without making any contact; however, it is preferred that each signal line be formed outside lower electrode 41 (see FIG. 9).

Meanwhile, upper electrode 42 is a plain pattern formed on the upper surface of high-$_K$ dielectric layer 43. Upper electrode 42 has pass-through holes 42a. Lower via-hole conductors 45, as first via-hole conductors, penetrate pass-through holes 42a without touching upper electrode 42. Lower via-hole conductors 45 electrically connect lower electrode 41 and ground conductive layer 22G, which is among conductive layers 22 of core substrate 20. Upper electrode 42 may have pass-through holes, not shown in the drawing, that allow each signal line to penetrate vertically without making any contact; however, it is preferred that each signal line be formed outside upper electrode 42 (see FIG. 9).

The total thickness of high-$_K$ dielectric layer 43 is in the range of 0.4-3 μm. High-$_K$ dielectric layer 43 is formed by laminating three layers of ceramic films made of one, or two or more, kinds of metal oxides selected from among a group of $BaTiO_3$, $SrTiO_3$, $TaO_3$, $Ta_2O_5$, PZT, PLZT, PNZT, PCZT and PSZT.

Those ceramic films are, as shown in FIG. 3, listed in order from lower electrode 41, first sputter film 43a formed by sputtering, sol-gel film 43b formed by a sol-gel method, and second sputter film 43c formed by sputtering. Here, first and second sputter films (43a, 43c) each have a thickness of 0.1 μm or more, and the thickness of sol-gel film 43b is greater than that of first and second sputter films (43a, 43c).

Build-up section 30 is formed on the upper side of thin-film capacitor 40 by alternately laminating insulation layers in the build-up section BU insulation layers 36 and BU conductive layers 32. BU conductive layers 32, disposed on the upper and lower surfaces of BU insulation layer 36 to sandwich it, are electrically connected to each other by means of BU via-hole conductors 34. Also, BU conductive layers 32 and upper electrode 42 of thin-film capacitor 40 are electrically connected by means of BU via-hole conductors 34.

By considering the finer features of build-up section 30, the thickness of BU conductive layers 32 is less than that of lower electrode 41. Also, mounting section 60 is formed on the outermost surface of build-up section 30. Such build-up section 30 is formed using a well-known subtractive method or additive method including semi-additive method or full additive method. For example, first, a resin sheet, which becomes BU insulation layer 36 (its Young's modulus at room temperature is, for example, 2-7 GPa) is laminated on both upper and lower surfaces of core substrate 20; such resin sheet is formed with denatured epoxy-resin type sheet, polyphenylene ether type resin sheet, polyimide type resin sheet, cyano-ester type resin sheet or the like and its thickness is approximately in the range of 20-80 μm. Such resin sheets may have inorganic ingredients such as silica, alumina or zirconia scattered therein.

Next, through-holes are formed in the laminated resin sheet using a carbon-dioxide gas laser, UV laser, YAG laser or exima laser. Electroless copper plating is performed on the surface of the resin sheet and inside through-holes to make conductive layers. A plating resist is formed on the conductive layers and electrolytic copper plating is performed on the portion where the plating resist is not formed. BU conductive layers 32 are formed by removing the electroless copper plating under the resist using an etching solution. The conductive layer inside the through-hole becomes BU via-hole conductor 34. Then, by repeating the above procedure, build-up section 30 is formed. In the present embodiment, lower electrode 41 of thin-film capacitor 40 is made thicker than BU conductive layer 32.

Next, an example of how to use multilayer printed wiring board 10 formed as above is described. First, semiconductor element 70 with numerous solder bumps on the back surface is mounted on mounting section 60. At that time, ground terminals, power-source terminals and signal terminals of semiconductor element 70 make contact respectively with ground pads 61, power-source pads 62 and signal pads 63 of mounting section 60. Then, each terminal is bonded by solder through a reflow process.

After that, multilayer printed wiring board 10 is bonded to another printed wiring board such as a mother board. At that time, solder bumps are formed in advance on the pads formed on the back surface of multilayer printed wiring board 10, then bonded by a reflow process to corresponding pads on the other printed wiring board. Since thin-film capacitor 40 built into multilayer printed wiring board 10 has high-$_K$ dielectric layer 43 made of ceramics with a high dielectric constant, and lower electrode 41 and upper electrode 42 are plain patterns (partially) open with large areas, its capacitance is large. Therefore, it may have a sufficient decoupling effect. Accordingly, the transistor of semiconductor element IC 70 mounted on mounting section 60 seldom experiences power shortages.

Moreover, when ground electrical potential is applied to the ground lines and positive electrical potential is applied to the power-source lines from power source PW, lower electrode 41 formed with a metal having a large ionization tendency becomes negatively charged and upper electrode 42 formed with a metal having a small ionization tendency becomes positively charged. Here, a migration phenomenon tends to occur in upper electrode 42 second electrode that charges positive charges. Therefore, the ionization tendency of a metal to form lower electrode 41 is set to be larger than the ionization tendency of a metal to form upper electrode 42. In so doing, a migration phenomenon especially from upper electrode 42 to the dielectric layer or to insulation layer (high-$_K$ dielectric layer) 43 may seldom occur. Accordingly, insulation resistance may seldom decrease, current leakage may be suppressed, and the dielectric constant of high-$_K$ dielectric layer 43 may seldom decrease. Furthermore, the lifespan of the multilayer printed wiring board may be reduced at a slower rate. If required, a chip capacitor may be loaded around mounting section 60 of multilayer wiring board 10.

Next, the steps for manufacturing a multilayer printed wiring board 10 according to this example are described with reference to FIGS. 4-8.

Figure 4A:
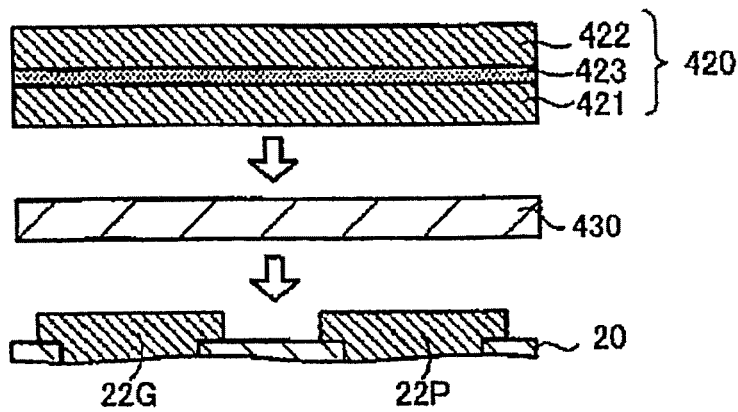
FIGS. 4A-4D are views illustrating steps to manufacture a printed wiring board according the embodiment of FIG. 1.

First, as shown in FIG. 4A, core substrate 20 is prepared, and on core substrate 20 thermosetting insulation film 430 (ABF-45SH, made by Ajinomoto Fine-Techno Co., Inc.,) that will become insulation layer 26 on the core substrate shown in FIG. 2) is laminated under the lamination conditions of temperature 50-150° C. and pressure 0.5-1.5 MPa.

Figure 4B:
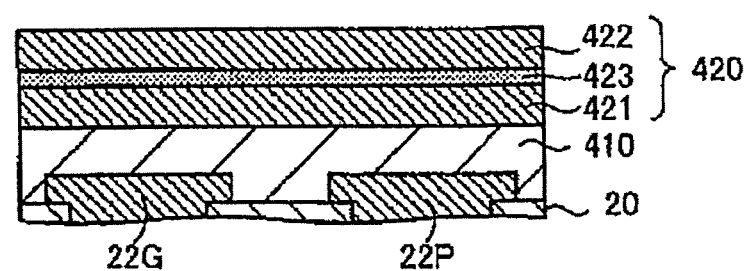
Figure 4C:
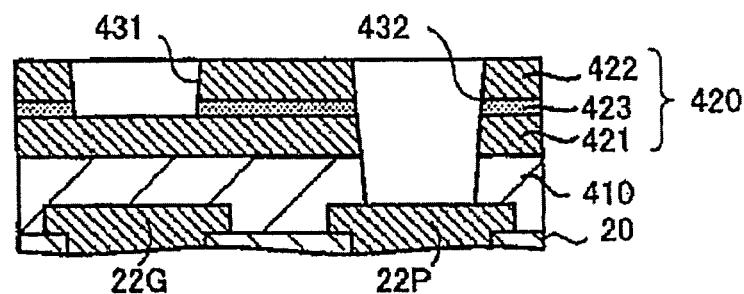
Figure 4D:
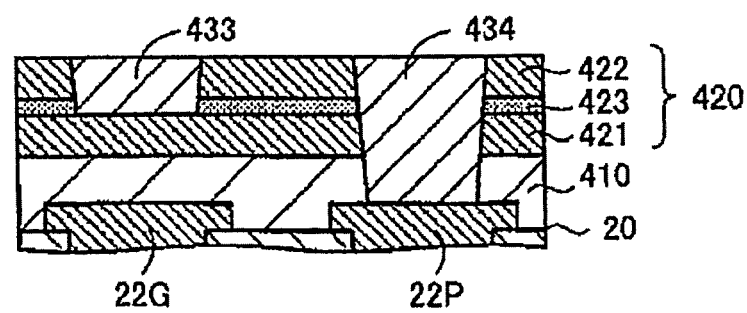

Then, high-$_K$ dielectric sheet 420 structured with high-$_K$ dielectric layer 423, which is sandwiched between nickel foil 421 and copper foil 422, is laminated on thermosetting insulation film 430 using a vacuum laminator under the lamination conditions of temperature 50-150° C. and pressure 0.5-1.5 MPa, and is dried at 150° C. for an hour (see FIG. 4B). By doing so, thermosetting insulation film 430 is set and becomes interlayer insulation layer 410. Since interlayer insulation layer 410 is formed on core substrate 20, it becomes insulation layer 26 on the core substrate. Here, nickel foil 421 and copper foil 422 of high-$_K$ dielectric sheet 420 at the time of lamination are both plain layers on which circuits are not formed. However, nickel foil 421, portions of which are etched away beforehand, since they later become unnecessary (for example, portions that will become pass-through holes 41a), may be laminated.

Next, the steps for manufacturing high-$_K$ dielectric sheet 420 are described with reference to FIG. 5.

First, nickel foil 421 electrode with a thickness of approximately 100 μm is prepared (see FIG. 5A), then processed under a thermal treatment at 400-700° C. (here at 550° C.). The thermal treatment is performed to enhance the crystallinity of high-$_K$ dielectric layer 423 formed on nickel foil 421.

Then, the surface of nickel foil 421 is polished. After polishing, the thickness becomes approximately 90 μm. On the surface of nickel foil 421, first sputter film 423a is formed (see FIG. 5B). Namely, after the BaTiOx target made by Kojundo Kagaku K.K. High-Purity Chemical Corp. is mounted in a magnetron sputtering apparatus series No. L-332S-FH, made by Canon Anelva Corp., a DC or AC power source is applied, and sputtering is performed using a gas mainly containing argon and oxygen at 3-10 mTorr. The ratio of oxygen in the sputtering gas is preferred to be 10-90 volume percent, more preferably 45-55 volume percent. In this embodiment, it is set at 50 volume percent. Also, the RF power is set at 2-5 W/cm$^2$ and the sputtering pressure is set at 0.5-2 Pa. By doing so, first sputter film 423a with a film thickness of 0.25 μm is formed. Since the film thickness of first sputter film 423a is small, even if pits 450 occur on its surface, pits 450 are small and shallow.

Figure 5A:
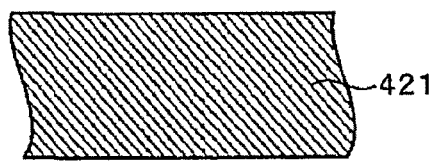
FIGS. 5A-5E are views illustrating steps to manufacture a high-$_K$ dielectric sheet according to Embodiment 1.
Figure 5B:
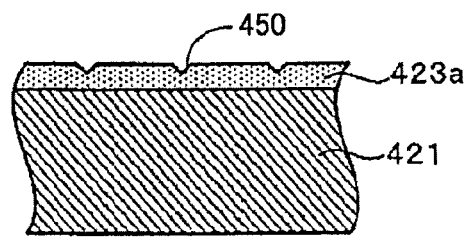
Figure 5C:
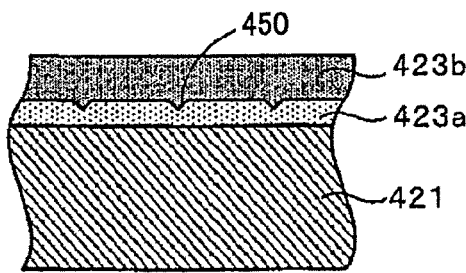

Then, sol-gel film 423b is formed on first sputter film 423a (see FIG. 5C). Namely, first, diethoxy barium and titanium bitetraisopropoxide are weighed in a dry nitrogen atmosphere to prepare a solution with a concentration of 1.0 mol/liter in a mixed solvent of dehydrated methanol and 2-methoxyethanol volume ratio 3:2. Then, the solution is blended for three days in a nitrogen atmosphere at room temperature to prepare a solution containing a barium-titanium alkoxide precursor composition. Then, decarbonated water is sprayed at a speed of 0.5 microliter/minute in an atmospheric nitrogen current to hydrolyze the precursor composition solution while blending it at a constant temperature of 0° C. to make a sol-gel solution. The sol-gel solution is filtered through a 0.2-micron filter to remove precipitates. The filtered solution is spincoated on first sputter film 423a at a speed of 1,500 rpm for one 1 minute. After the solution is spincoated, the substrate is dried for three 3 minutes on a hot plate at a constant temperature of 150° C., then put in an electric oven having a constant temperature of 850° C. to calcine the substrate for 15 minutes. The calcination may be performed at a temperature in the range of 600° C.-2,000° C., preferably in the range of 1,100° C.-2,000° C. As described above, after first sputter film 423a is formed on nickel foil 421 (which later becomes the lower electrode) and sol-gel film 423b is further formed using a sol-gel method, calcination is performed. The viscosity of the sol-gel solution is adjusted so that the film thickness after a spincoat/dry/calcine cycle becomes 0.03 μm. After repeating 10 spincoat/dry/calcine cycles, sol-gel film 423b with a thickness of 0.3 μm is formed. Pits 450 that appear on the surface of first sputter film 423a are filled with the sol-gel solution when the sol-gel film 423b is formed.

Figure 5D:
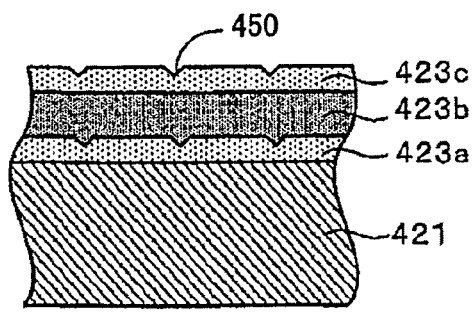
Figure 5E:
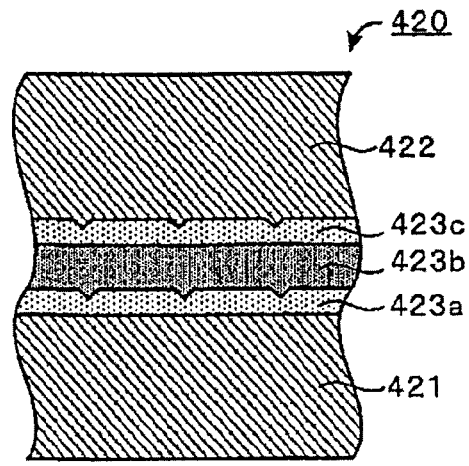

Then, second sputter film 423c is formed on sol-gel film 423b (see FIG. 5D). Second sputter film 423c is formed to make the film thickness 0.15 μm using the same magnetron sputtering apparatus as used for first sputter film 423a. As a result, high-$_K$ dielectric layer 423 with a total film thickness of 0.7 μm is formed on nickel foil 421. Since the film thickness of second sputter film 423c is small, even if pits 450 occur on its surface, pits 450 are only small and shallow. Also, sol-gel film 423b is sandwiched between first and second sputter films (423a, 423c).

After that, a copper layer is formed by electroless plating on high-$_K$ dielectric layer 423. Then, by further adding another copper layer with an approximate thickness of 10 μm onto the copper layer using electrolytic plating or the like, metal film (copper foil) 422 made of copper (opposite electrode) is formed (see FIG. 5E). As described above, metal film (copper foil) 422 is formed on sol-gel film 423b with second sputter film 423c in between.

In doing so, high-$_K$ dielectric sheet 420 is obtained. After repeating 20 times a cycle in which high-$_K$ dielectric sheet 420 is left for five minutes at −55° C. and then left for five minutes at 125° C., a sheet free of defects such as cracks will be used in the next step. The dielectric characteristics of high-$_K$ dielectric sheet 420 obtained following the above procedure are measured using IMPEDANCE/GAIN-PHASE ANALYZER (made by Hewlett-Packard Company, product name 4194A) under the conditions of frequency 1 kHz, temperature 25° C. and OSC level 1 V. Its dielectric constant was 1,300. The high-$_K$ dielectric layer is made of barium titanate. However, any of the following may be used: strontium titanate (SrTiO3), tantalum oxides (TaO3, Ta2O5), lead zirconate titanate (PZT), lead lanthanum zirconate titanate (PLZT), lead niobium zirconate titanate (PNZT), lead calcium zirconate titanate (PCZT) or lead strontium zirconate titanate (PSZT).

Referring to FIGS. 4A-4D again, through-holes (431, 432) are formed by a laser at predetermined positions of the unfinished substrate having laminated high-$_K$ dielectric layer 420 (see FIG. 4C). Namely, at the position facing ground conductive layer 22G of core substrate 20, through-hole 431 is formed, penetrating copper foil 422 and high-$_K$ dielectric layer 423 and reaching the surface of nickel foil 421. Then, at the position facing power-source conductive layer 22P of core substrate 20, through-hole 432 is formed, penetrating high-$_K$ dielectric sheet 420 and interlayer insulation layer 410, and reaching the surface of power-source conductive layer 22P of core substrate 20. Here, when forming through-holes, deep through-hole 432 is first formed and then shallow through-hole 431 is formed. Adjustment of the depth is conducted by changing the number of laser shots.

Specifically, through-hole 432 is formed by using a UV laser (made by Hitachi Via Mechanics, Ltd.) under the conditions of power output 3-10 W, frequency 25-60 kHz, and number of shots 62; through-hole 431 is formed under the same conditions, except that the number of shots is 22. Then, through-holes (431, 432) are filled with through-hole filling resin, which is then dried for an hour at 80° C., for an hour at 120° C., then for 30 minutes at 150° C. to fill inner-hole resins (433, 434) (see FIG. 4D). Here, the through-hole filling resin is prepared as follows: 100 weight parts of bisphenol-F epoxy monomer (made by Japan Epoxy Resins, Co., Ltd., molecular amount: 310, product name: E-807) are mixed with 6 weight parts of imidazole curing agent (made by Shikoku Chemicals Corporation, product name: 2E4MZ-CN). Furthermore, 170 weight parts of spherical particles $SiO_2$ with an average particle diameter of 1.6 µm are added to the mixture, and the viscosity of the mixture is adjusted to 45,000-49,000 cps at a temperature of 23±1° C. by kneading the mixture using three rollers. Accordingly, the through-hole filling resin is obtained.

Figure 6A:
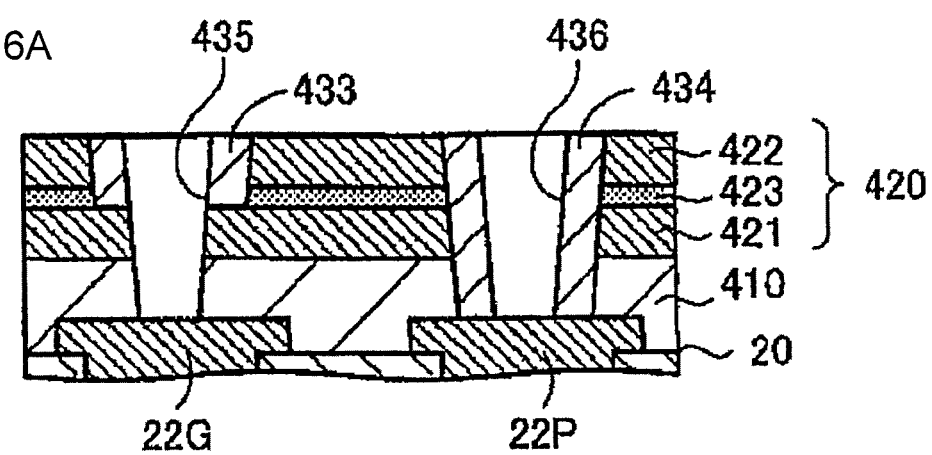
FIGS. 6A-6B are views illustrating steps to manufacture a printed wiring board according to the embodiment of FIG. 1.
Figure 6B:
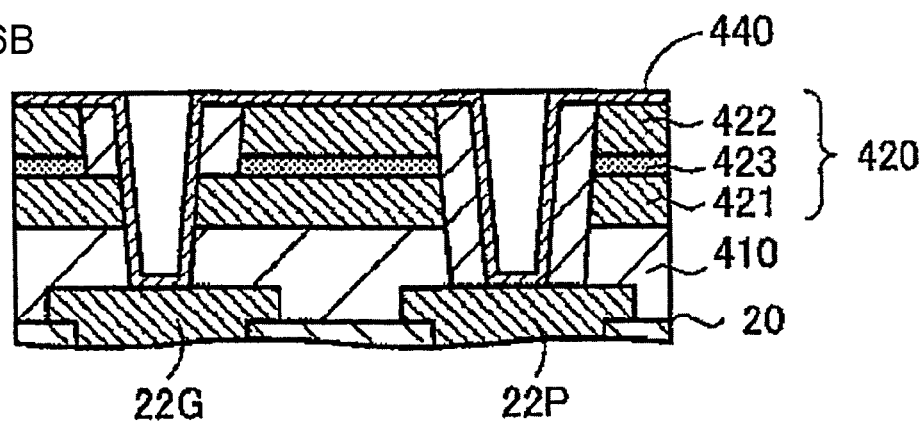

Next, through-holes (435, 436) are formed in inner-hole resins (433, 434) and immersed in a permanganate solution to become roughened, then dry set for three hours at 170° C. until completely cured (see FIG. 6A). Through-hole 435 has a smaller diameter than inner-hole resin 433, penetrating inner-hole resin 433, nickel foil 421 and interlayer insulation layer 410, and reaching the surface of conductive layer 22G. The other through-hole 436 has a smaller diameter than inner-hole resin 434, and penetrates inner-hole resin 434 and reaches conductive layer 22P.

Also, through-hole 435 is formed by using a UV laser under the conditions of frequency 25 kHz, power output 3 W and 52 shots. Through-hole 436 is formed by a $CO_2$ laser through a 1.4-mm diameter mask under the conditions of energy density 2.0 mj, pulse width 20 µsec. and 2 shots. Then, after a catalyst for electroless copper plating is applied to its surface, the substrate is immersed in an electroless copper plating solution to form electroless copper-plated film 440 with a thickness in the range of 0.6-3.0 µm on its surface (see FIG. 6B). The composition of the electroless copper plating solution is as follows: copper sulfate: 0.03 mol/L, EDTA: 0.200 mol/L, HCHO: 0.1 g/L, NaOH: 0.1 mol/L, α,α'-bipyridyl: 100 mg/L, polyethylene glycol (PEG): 0.1 g/L.

Figure 7A:
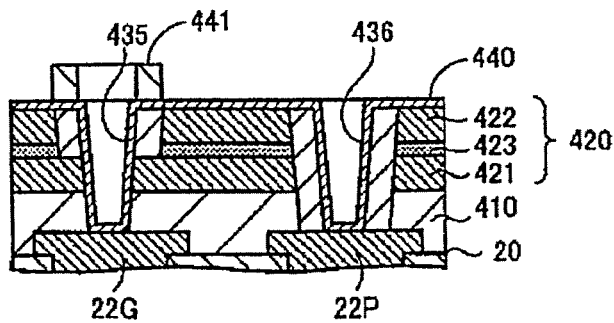
FIGS. 7A-7D are views illustrating steps to manufacture a printed wiring board according to the embodiment of FIG. 1.
Figure 7B:
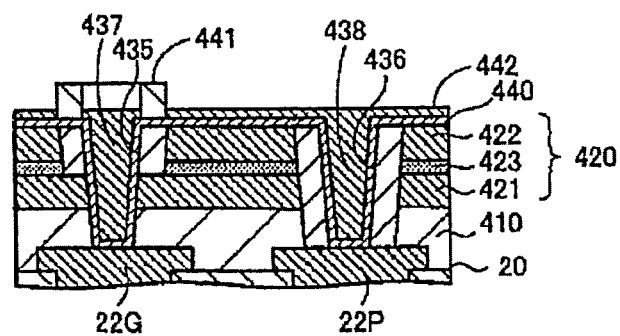
Figure 7C:
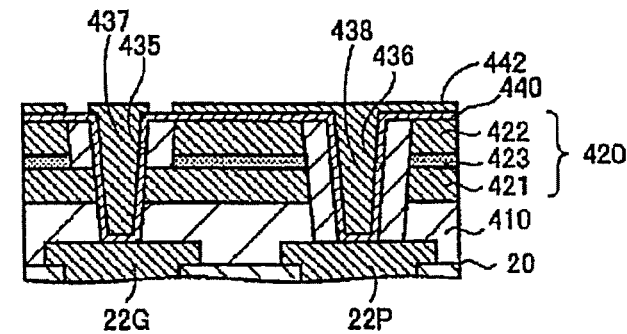
Figure 7D:
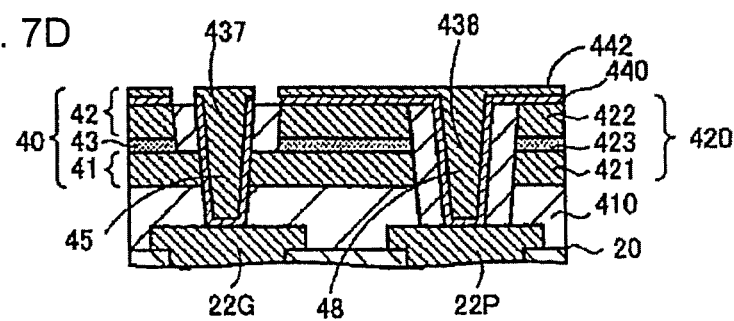

Then, a commercially available dry film is laminated on electroless copper plated film 440, exposed to light and developed to form doughnut-shaped resist 441, which surrounds the opening of through-hole 435 (see FIG. 7A). Then, on the area where the plating resist is not formed, 25 µm-thick electrolytic copper plated film 442 is formed on electroless copper-plated film 440 (see FIG. 7B). As a result, the interiors of through-holes (435, 436) respectively become via-hole conductors (437, 438) filled with plated copper. The composition of the electrolytic copper plating solution is as follows: sulfuric acid: 200 g/L, copper sulfate: 80 g/L, additive: 19.5 ml/L made by (Atotech Japan, Cupracit GL).

Also, the electrolytic copper plating is performed as follows. Namely, current density is set at 1 A/dm2, time at 115 minutes and temperature at 23±2° C. Then, plating resist 441 is removed (see FIG. 7C). The area of electroless copper plated film 440 covered by plated resist 441 is removed by etching (quick etching) using a sulfuric acid-hydrogen peroxide type etching solution (see FIG. 7D). In doing so, via-hole conductor 437 becomes electrically disconnected from copper foil 422.

Following the above procedure, thin-film capacitor 40 is formed on core substrate 20 as a capacitor section. Namely, nickel foil 421 becomes lower electrode 41 as the first electrode and high-$_K$ dielectric layer 423 becomes high-$_K$ dielectric layer 43. Portions of copper foil 422, electroless copper plated film 440 and electrolytic copper plated film 442, that are positioned above high-$_K$ dielectric layer 423, are integrated to become upper electrode 42 as the second electrode. Also, via-hole conductor 437 becomes lower via-hole conductor 45 and via-hole conductor 438 becomes upper via-hole conductor 48.

When forming through-holes (431, 432, 435, 436) in high-$_K$ dielectric sheet 420, through-holes (431, 432, 435, 436) may be formed easily and precisely by aiming alignment mark 310. Alignment mark 310 is formed at the same time as conductive layers 22 of core substrate 20. Alignment mark 310 is preferred to be covered by an insulation layer. Also, alignment mark 310 is preferred to be formed on a resin insulation layer positioned one layer beneath the resin insulation layer on which the capacitor section is laminated. Alternatively, alignment mark 310 is preferred to be formed on core substrate 20 positioned one layer beneath the resin insulation layer on which the capacitor section is laminated.

Next, the unfinished substrate with formed electrolytic copper-plated film 442 is treated in a black oxide bath oxidation bath using a solution containing NaOH 10 g/L, $NaClO_2$ 40 g/L, and $Na_3PO_4$ 6 g/L and then treated in a reduction bath using a solution containing NaOH 10 g/L and $NaBH_4$ 6 g/L. Accordingly, the surface of electrolytic copper-plated film 442 is roughened not shown in the drawing. After that, resin insulation sheet 480 is laminated on the roughened surface by using a vacuum laminator under lamination conditions of temperature 50-150° C. and pressure 0.5-1.5 MPa, then cured for three hours at 150° C. (see FIG. 8A).

Resin insulation sheet 480 is made of denatured epoxy type resin sheet, polyphenylene ether type resin sheet, polyimide type resin sheet, cyano ester type resin sheet or imide type resin sheet. Resin sheet 480 may contain thermoplastic resin such as polyolefin type resin or polyimide type resin, thermosetting resin such as silicone resin, and/or rubber type resin such as SBR, NBR, or urethane, and may also contain fiber-, filler- or flat-shaped inorganic materials such as silica, alumina or zirconia dispersed therein.

Figure 8A:
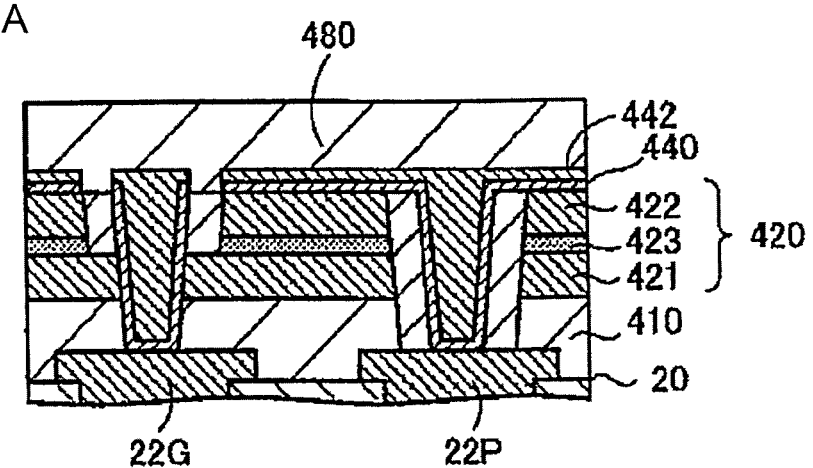
FIGS. 8A-8C are views illustrating steps to manufacture a printed wiring board according to the embodiment of FIG. 1.
Figure 8B:
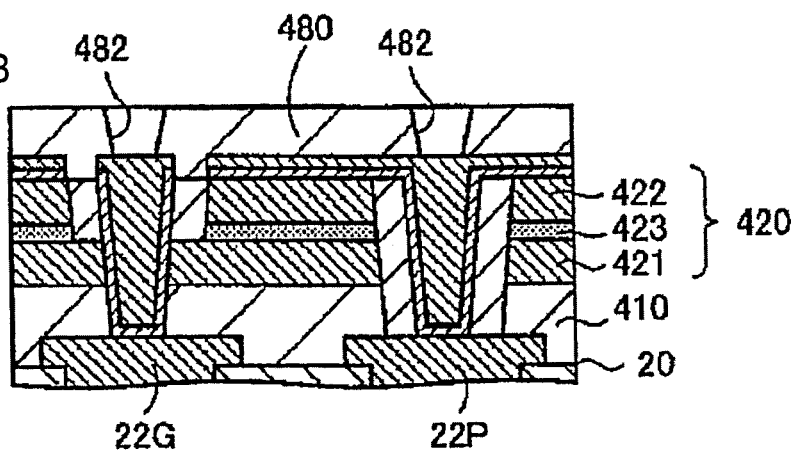

Then, hole 482 is formed at a predetermined position of resin insulation sheet 480 using a $CO_2$ laser (see FIG. 8B). After that, a roughening process and electroless copper plating are carried out. Next, a plating resist is laminated, exposed to light, and developed to form a pattern on the plating resist. Then, pattern plating is performed by electrolytic copper plating. After removing the plating resist, portions of electroless copper-plated film covered by the plating resist are removed by etching and BU conductive layer 32 is formed (see FIG. 8C).

Figure 8C:
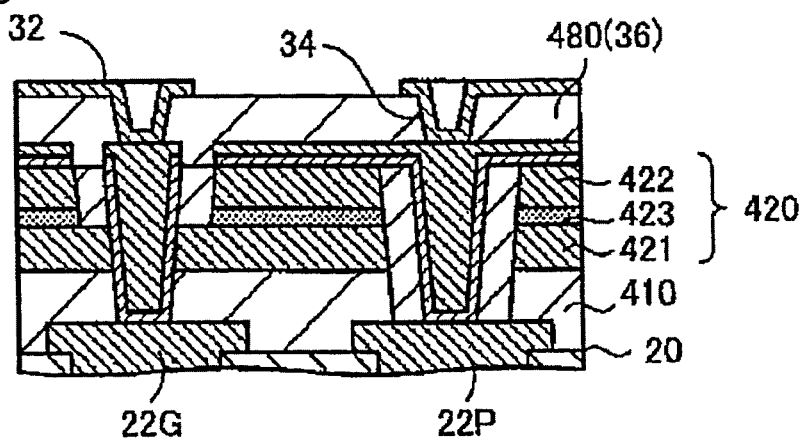

Referring to FIG. 8C, resin insulation sheet 480 becomes BU insulation layer 36, and the plating in hole 482 becomes via-hole conductor 34. By repeating the steps shown in FIGS. 8A-8C, build-up section 30 (see FIG. 2) is completed. On the uppermost layer of build-up section 30, each pad (61, 62, 63) is formed and multilayer printed wiring board 10 shown in FIGS. 1 and 2 is obtained.

According to the present embodiment described above in detail, in a method to manufacture high-$_K$ dielectric sheet 420, which is to become thin-film capacitor 40, if pits 450 occur on its surface when first sputter film 423a is formed, the sol-gel solution seeps into pits 450 and fills pits 450. Then, second sputter film 423c is formed on sol-gel film 423b. Since second sputter film 423c is thinner than that in a case where high-$_K$ dielectric layer 43 is made of a single sputter film, even if pits 450 occur in second sputter film 423c, pits 450 will be smaller and shallower. Namely, in high-$_K$ dielectric layer 423, if pits 450 occur on the surface opposite nickel foil 431, pits 450 are smaller and shallower than those that may occur in a high-$_K$ dielectric layer made of a single sputter film. Therefore, even if foreign materials metals such as copper, resin or the like enter pits 450, those foreign materials will not cause a major impact thereon.

Meanwhile, sol-gel film 423b is sandwiched between first and second sputter films (423a, 423c), and thus is not exposed to the outside. Therefore, even if pinholes are formed in sol-gel film 423b, the plating solutions used during the process to form copper foil 422 do not seep into those pinholes. Accordingly, cracks may be prevented from occurring in high-$_K$ dielectric layer 43 of thin-film capacitor 40, and short-circuits between lower electrode 41 and upper electrode 42 may be prevented as well.

Also, since high-$_K$ dielectric layer 423 is made thin with a thickness in the range of 0.4-3 µm, the capacitance of thin-film capacitor 40 may be made large. Therefore, a sudden falloff of power-source electrical potential caused by high-speed on/off switching of semiconductor element 70 mounted on multilayer printed wiring board 10 may be further effectively suppressed.

Furthermore, by making each thickness of first and second sputter films (423a, 423c) 0.1 µm or greater, sol-gel film 423b, sandwiched between first and second sputter films 423a and 423c, may be securely isolated from the surroundings.

Also, since sol-gel film 423b is formed thicker than first and second sputter films (423a, 423c), pits 450 that could occur in first and second sputter films (423a, 423c) are even smaller and shallower, and thus problems caused by pits 450 may be further prevented from occurring. Moreover, in the above-mentioned embodiment, second sputter film 423c is formed thinner than first sputter film 423a, thus further preventing problems from occurring.

Then, on high-$_K$ dielectric sheet 420 shortly after it is manufactured, low- and high-temperature treatments are conducted multiple times to select a sheet that shows no defects and use it in the next step. Accordingly, potentially problematic high-$_K$ dielectric sheet 420 may be excluded before mounting it on multilayer printed wiring board 10, thus making it preferable costwise, in contrast to a case in which a sheet needs to be removed after it is mounted.

Figure 10:
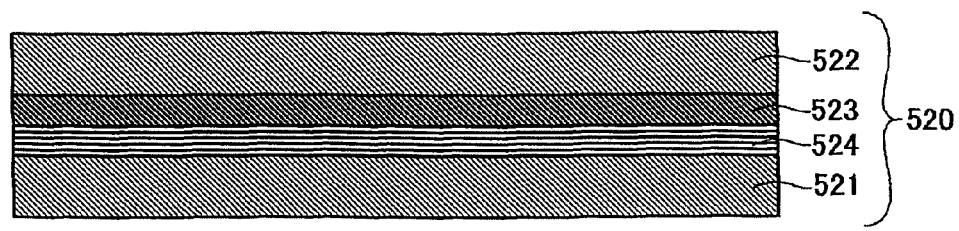
FIG. 10 is a view illustrating a high-$_K$ dielectric sheet used in a multilayer printed wiring board according to another embodiment.

In the above-described embodiment, high-$_K$ dielectric sheet 420 was laminated on thermosetting insulation film 430. In multilayer printed wiring board 10 according to another embodiment, high-$_K$ dielectric sheet 520 as shown in FIG. 10 is used instead of high-$_K$ dielectric sheet 420. High-$_K$ dielectric sheet 520 is structured by forming sputter film 524 on nickel foil 521 using a sputtering method, forming sol-gel film 523 on sputter film 524 using a sol-gel method and further disposing copper foil 522 on sol-gel film 523.

Both sputter film 524 and sol-gel film 523 are made of $BaTiO_3$. The thickness of sputter film 524 is preferred to be in the range of 0.2-0.3 µm. The thickness of sol-gel film 523 is also preferred to be in the range of 0.2-0.3 µm. Voltage is applied from power source PW to a multilayer wiring board with a built-in capacitor. The built-in capacitor is formed by sandwiching a dielectric layer structured with sputter film 524 and sol-gel film 523 between a first electrode formed with a metal having a large ionization tendency on the side of sputter-film 524 and a second electrode formed with a metal having a small ionization tendency on the side of sol-gel film 523. The voltage is applied either using the first electrode as an anode and the second electrode as a cathode or using the first electrode as a cathode and the second electrode as an anode. Either way, it is presumed that a migration of the metals forming the electrodes is prevented and a falloff of insulation resistance in the printed wiring board with a built-in capacitor is suppressed.

Figure 11:
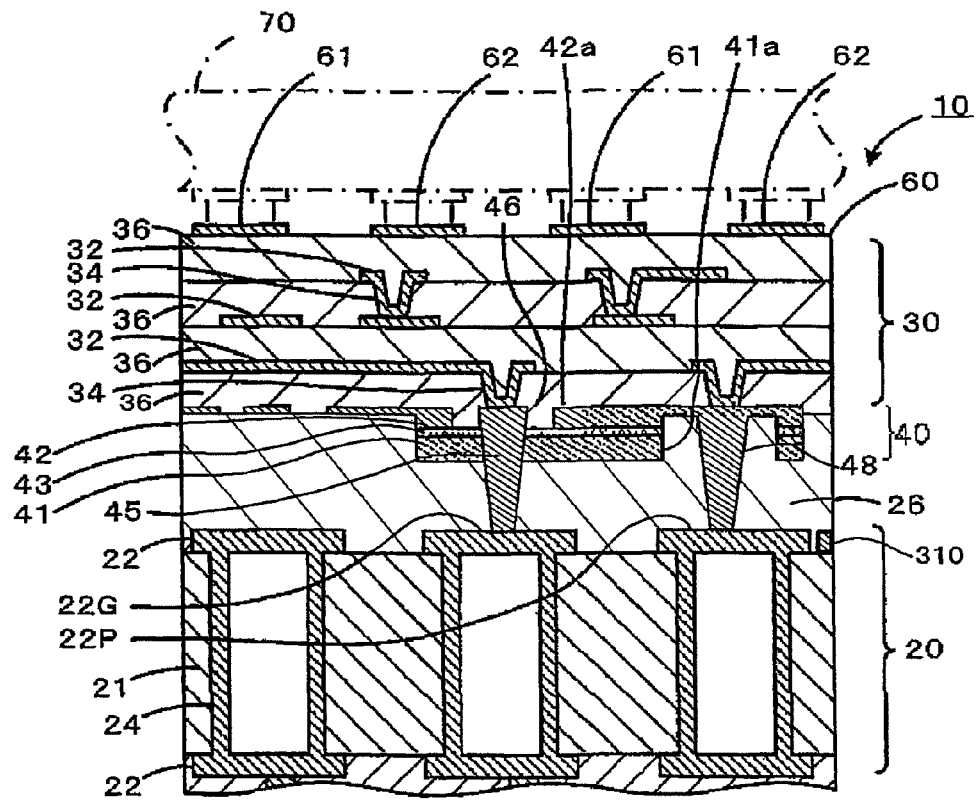
FIG. 11 is a cross-sectional view illustrating a part of a printed wiring board according to yet another embodiment.

In the above-described embodiment, thin-film capacitor 40 was laminated on insulation layer 26 on the core substrate. In multilayer printed wiring board 10 according to another embodiment, thin-film capacitor 40 is built in insulation layer 26 on the core substrate as shown in FIG. 11. As shown in an enlarged view around thin-film capacitor 40 illustrated in FIG. 12, second electrode 42 is structured by laminating metal-film copper foil 422 and a copper-plated film. The copper-plated film is formed with electroless copper plated film 440 and electrolytic copper-plated film 442.

Figure 12:
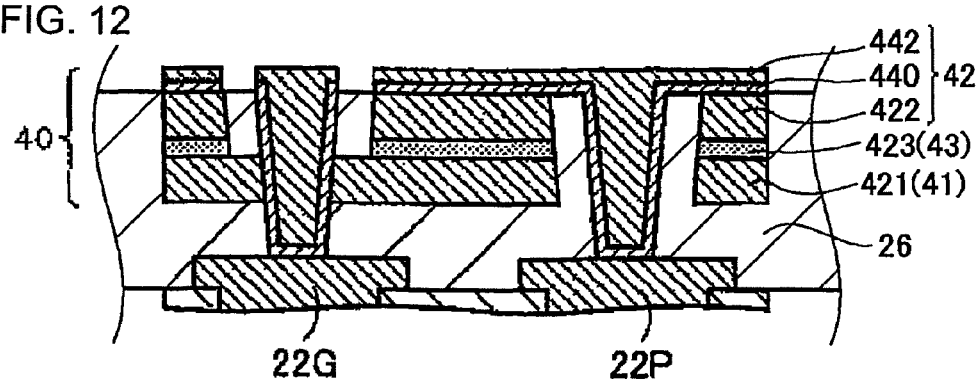
FIG. 12 is an enlarged view illustrating the vicinity of a capacitor section in a multilayer printed wiring board according to the embodiment of FIG. 11.

The upper surface of copper foil 422 and the upper surface of resin insulation layer 26 on the core substrate are made flush. Therefore, when capacitor section 40 is built in insulation layer 26 on the core substrate, it indicates that the portion of second electrode 42 below electroless copper-plated film 440 is also built in insulation layer 26 on the core substrate as shown in FIG. 12.

Figure 13A:
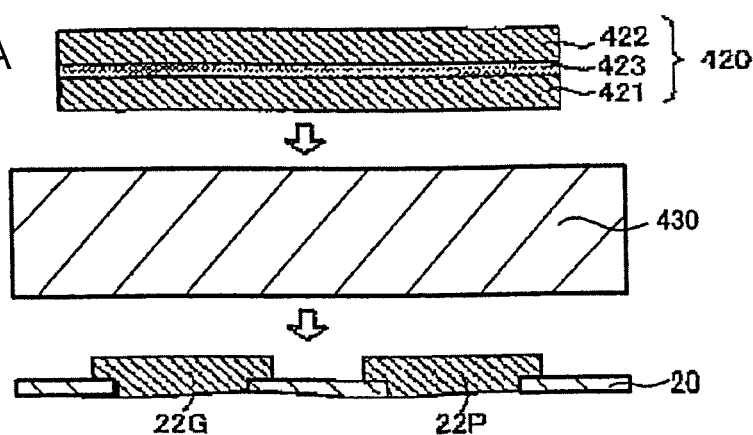
FIGS. 13A-13B are views illustrating part of steps to manufacture a multilayer printed wiring board according to the embodiment of FIG. 11.

The method for manufacturing multilayer printed wiring board 10 according to the embodiment of FIG. 11 is as follows: first, as shown in FIG. 13A, core substrate 20 is prepared. Then, a thermosetting insulation film (ABF-45SH made by Ajinomoto Fine-Techno Co., Ltd.) is laminated on core substrate 20 by using a vacuum laminator under lamination conditions of temperature 50-150° C. and pressure 0.5-1.5 MPa. Two sheets of thermosetting insulation film 430 are laminated to enlarge the thickness of insulation layer 26 on the core substrate so that thin-film capacitor 40 may be built in insulation layer 26 on the core substrate. Three or more sheets of thermosetting insulation film 430 may be laminated. Then, high-$_K$ dielectric sheet 420 structured with high-$_K$ dielectric layer 423 sandwiched between nickel foil 421 and copper foil 422 is aligned with and laminated on semi-cured thermosetting insulation film 430. Their alignment may be conducted by recognizing alignment mark 310 formed on core substrate 20 as a mark for alignment with a camera.

Figure 13B:
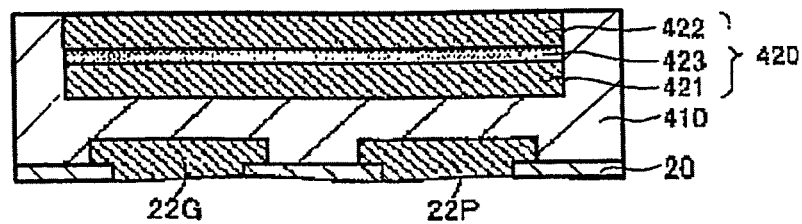
Figure 14:
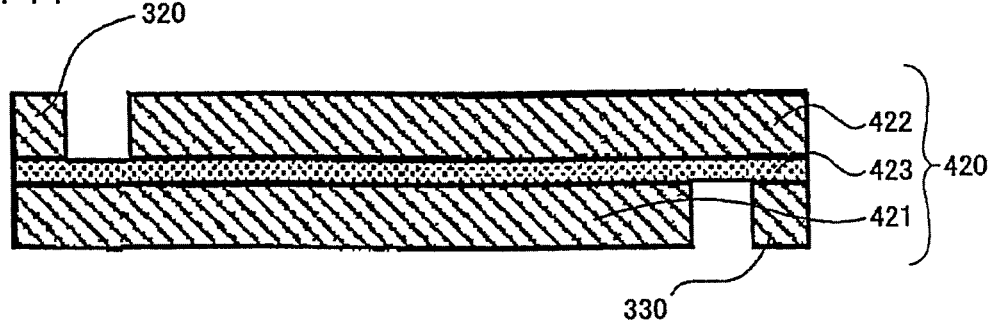
FIG. 14 is a view illustrating another structure of a high-$_K$ dielectric sheet.

As shown in FIG. 14, alignment marks (320, 330) may also be formed in high-$_K$ dielectric sheet 420. At the right end of nickel foil 421 in FIG. 14, alignment mark 330 is formed. Alignment mark 330 is already patterned in nickel foil 421. Also, at the left end of copper foil 422 in FIG. 14, alignment mark 320 is formed. Alignment mark 320 may be formed by pattern plating when performing electroless plating and electrolytic plating on high-$_K$ dielectric layer 423. Alignment between high-$_K$ dielectric sheet 420 and core substrate 20 or thermosetting insulation film 430 is conducted by recognizing alignment mark 320 or alignment mark 330 formed in high-$_K$ dielectric sheet 420 and alignment mark 310 formed on core substrate 20; it may be conducted by recognizing alignment mark 320 and alignment mark 310, or by recognizing alignment mark 330 and alignment mark 310. Then, as shown in FIG. 13B, by vacuum pressing under the conditions of 0.4 MPa, 170° C. and two hours, high-$_K$ dielectric sheet 420 is embedded in semi-cured thermosetting insulation film 430. Then, thermosetting insulation film 430 is cured to form interlayer insulation layer 410. Since interlayer insulation layer 410 is formed on core substrate 20, it also indicates insulation layer 26 on the core substrate shown in FIG. 11. The rest of the method for manufacturing a multilayer printed wiring board is the same as in Embodiment 1 with reference to FIG. 4C to FIG. 8C.

The present invention is not limited to the above-mentioned embodiments, but may be practiced in varieties of examples as long as they stay within the technical scope of the present invention. For example, in the above embodiments, from power source PW ground electrical potential was applied to ground lines 73 and positive potential was applied to power-source lines 71. However, the present invention is not limited to such; from power source (PW) negative potential may be applied to ground lines 73 and positive potential may be applied to power-source lines 71. The gist of the present invention regarding the embodiments is that in a capacitor having electrodes made of different metals, relatively low potential is applied to the electrode made of a metal having a large ionization tendency, and relatively high potential is applied to the electrode made of a metal having a small ionization tendency.

Also, in the above embodiments, for example, thin-film capacitor 40 was formed on core substrate 20 and build-up section 30 was formed on thin-film capacitor 40. However, the present invention is not limited to such; build-up section 30 may be built on core substrate 20 and thin-film capacitor 40 may be built on build-up section 30.

Also, in the above embodiments, nickel was used for lower electrode 41 and copper was used for upper electrode 42. However, the present invention is not limited to such; as long as the ionization tendency of a metal used for lower electrode 41 is greater than the ionization tendency of a metal used for upper electrode 42, other metals such as platinum, gold, silver or tin may also be used.

Furthermore, in the above embodiments, lower electrode 41 is formed with a single layer of nickel and upper electrode 42 is formed with a single layer of copper. However, the present invention is not limited to such; even if lower electrode 41 and upper electrode 42 are formed with multiple layers of different kinds of metals, migration phenomena may be suppressed by disposing a metal having a large ionization tendency in the electrode that charges negative charges and disposing a metal having a small ionization tendency in the electrode that charges positive charges.

In the above embodiments, sputtering was performed using a magnetron sputtering apparatus, but a tripolar sputtering apparatus or an ion-beam sputtering apparatus may also be used.

In the above embodiments, the cross-sectional configuration of BU via-hole conductor 34 was set like a tumbler a so-called conformal via. However, the interior of the tumbler may be filled with metal or conductive resin to form a so-called filled via.

In the above embodiments, high-$_K$ dielectric layer 43 was formed by a sol-gel method and was sandwiched between a nickel electrode and a copper electrode. Then, migration phenomena in the electrodes were prevented by applying relatively low voltage to the nickel electrode and relatively high voltage to the copper electrode. However, other migration prevention methods may also be employed. For example, the following structure may be employed: on high-$_K$ dielectric layer 43 formed by a sol-gel method, a relatively fine thin high-$_K$ dielectric film is formed by sputtering or the like; an electrode (for example, a nickel electrode) made of a metal having a large ionization tendency is disposed on the sputter-film side; and an electrode (for example, a copper electrode) made of a metal having a small ionization tendency is disposed on the sol-gel film side. Using this method, migration phenomena in the electrodes may be prevented effectively regardless of the voltage polarity applied thereto.

Regarding a multilayer printed wiring board with a capacitor structured with lower electrode 41 made of nickel, upper electrode 42 made of copper and a sol-gel film formed by a sol-gel method for high-$_K$ dielectric layer 43, ground potential is applied to ground lines 73 and positive potential is applied to power-source lines 71 from power source PW to measure insulation resistance values of the printed wiring board with a built-in capacitor.

In Comparative Example 1, lower electrode 41 was used as an anode and upper electrode 42 as a cathode. The conditions for measurement were applied voltage of 2 V and application time of 60 seconds. The insulation resistance value of Comparative Example 1 was ten to the power of one to two.

In Example 1, lower electrode 41 was used as a cathode and upper electrode 42 as an anode. The conditions for measurement were the same as in Comparative Example 1. The insulation resistance value of Example 1 was excellent, ten to the power of ten or larger.

In the above example, a sol-gel film formed by a sol-gel method was used as dielectric layer 43. However, if a three-layer structure of sputter film/sol-gel film/sputter film is used as dielectric layer 43, the insulation resistance value of the example showed an excellent result, ten to the power of ten or larger.

Next, lower electrode 41 was made of nickel and upper electrode 42 was made of copper, and as for dielectric layer 43, a sputter film was disposed on the side of lower-electrode 41 and a sol-gel film was disposed on the side of upper-electrode 42 to structure a capacitor. Then, regarding a multilayer printed wiring board having such a capacitor, ground potential is applied to ground lines 73 and positive potential is applied to power-source lines 71 from power source PW to measure insulation resistance values of the capacitor. The conditions for measurement were applied voltage of 2 V and application time of 60 seconds.

In either case, when lower electrode 41 was used as an anode and the upper electrode as a cathode, or when lower electrode 41 was used as a cathode and the upper electrode as an anode, the insulation resistance values were excellent, ten to the power of ten or larger.

The present invention may be used as a multilayer printed wiring board having a capacitor section in which migration phenomena in the electrodes seldom occur.

The invention claimed is:

1. A method for manufacturing a multilayer printed wiring board, comprising:
   providing a core substrate;
   laminating a resin insulation layer on the core substrate;
   forming a capacitor section including a high-$_K$ dielectric sheet and being coupled to the resin insulation layer by:
      providing a first electrode comprising a first metal,
      providing a second electrode opposing the first electrode, the second electrode comprising a second metal having a smaller ionization tendency than an ionization tendency of the first metal forming the first electrode,
      providing a dielectric layer interposed between the first and second electrode to form the high-$_K$ dielectric sheet, and
      providing alignment marks in the high-$_K$ dielectric sheet;
   forming an outermost insulating layer over the capacitor section;
   forming a ground pad on the outermost insulating layer and electrically connected to the first electrode; and
   forming a power source pad on the outermost insulating layer and electrically connected to the second electrode,
   wherein said forming a capacitor section includes selecting the first metal for forming a ground electrode of the capacitor section, selecting the second metal for forming a power source electrode of the capacitor section, wherein the first and second metals are selected such that the second metal has a smaller ionization tendency than the ionization tendency of the first metal, providing said first electrode formed of the first metal, and providing said second electrode opposing the first electrode and formed of the second metal.

2. The method for manufacturing a multilayer printed wiring board according to claim 1, wherein said forming a capacitor section comprises laminating the capacitor section on the resin insulation layer.

3. The method for manufacturing a multilayer printed wiring board according to claim 1, wherein said forming a capacitor section comprises:
forming a sol-gel film on the first electrode using a sol-gel method;
calcinating the sol-gel film at a temperature in the range of 600-2,000° C.; and
forming a second electrode on the sol-gel film.

4. The method for manufacturing a multilayer printed wiring board according to claim 1, wherein:
said forming the first electrode comprises forming the first electrode of nickel, and
said forming the second electrode comprises forming the second electrode of copper.

5. The method for manufacturing a multilayer printed wiring board according to claim 4, further comprising:
forming a via hole through the second electrode of the capacitor section;
forming a first metal film on the second electrode and within the via hole; and
forming a second metal film on the first metal film while forming a conductive via within the via hole.

6. The method for manufacturing a multilayer printed wiring board according to claim 1, wherein said forming a capacitor section comprises forming the capacitor section built in the resin insulation layer.

7. The method for manufacturing a multilayer printed wiring board according to claim 6, wherein:
said forming the second electrode comprises laminating a metal film on the dielectric layer and forming a plated film on the metal film, and
said forming a capacitor section comprises forming the capacitor section built in the resin insulation layer so that an outer surface of the metal film and an outer surface of the resin insulation layer are made flush.

8. The method for manufacturing a multilayer printed wiring board according to claim 6, further comprising forming an alignment mark on the core substrate, wherein the capacitor section is built in the resin insulation layer by using the alignment mark to align the capacitor section and the resin insulation layer.

9. The method for manufacturing a multilayer printed wiring board according to claim 1, further comprising:
forming a via hole through the second electrode of the capacitor section;
forming a first metal film on the second electrode and within the via hole; and
forming a second metal film on the first metal film while forming a conductive via within the via hole.

10. The method for manufacturing a multilayer printed wiring board according to claim 1, further comprising forming a signal line which does not pass through the capacitor section.

11. The method of claim 1, wherein said first and second metals are selected from copper, nickel, tin, platinum and gold such that the second metal has a smaller ionization tendency than the ionization tendency of the first metal.

12. A method for manufacturing a multilayer printed wiring board, comprising:
providing a core substrate;
laminating a resin insulation layer on the core substrate;
forming a capacitor section coupled to the resin insulation layer by:
providing a first electrode comprising a first metal,
providing a second electrode opposing the first electrode, the second electrode comprising a second metal having a smaller ionization tendency than an ionization tendency of the first metal forming the first electrode, and
providing a dielectric layer interposed between the first and second electrode;
forming an outermost insulating layer over the capacitor section;
forming a ground pad on the outermost insulating layer and electrically connected to the first electrode; and
forming a power source pad on the outermost insulating layer and electrically connected to the second electrode,
wherein said forming a capacitor section comprises:
forming a sputter film by sputtering on an inner surface of the first electrode, and
forming a sol-gel film using a sol-gel method on an inner surface of the second electrode which opposes the inner surface of the first electrode such that a dielectric layer is formed by the sputter film and the sol-gel film.

13. The method for manufacturing a multilayer printed wiring board according to claim 12, wherein said forming the first electrode comprises forming the first electrode of nickel.

14. The method for manufacturing a multilayer printed wiring board according to claim 13, wherein said forming the second electrode comprises forming the second electrode of copper.

15. The method for manufacturing a multilayer printed wiring board according to claim 12, wherein said forming the second electrode comprises forming the second electrode of copper.

* * * * *